(12) United States Patent
Krahn et al.

(10) Patent No.: US 7,919,963 B2
(45) Date of Patent: Apr. 5, 2011

(54) MAGNETIC RESONANCE RESONATOR ASSEMBLY

(75) Inventors: Alexander Krahn, Karlsruhe (DE); Peter Hoefer, Ettlingen (DE); Marian Kloza, Waldbronn (DE); Frank Engelke, Rheinstetten (DE)

(73) Assignee: Bruker Biospin, GmbH, Rheinstetten-Forchheim (DE)

( * ) Notice: Subject to any disclaimer, the term of this patent is extended or adjusted under 35 U.S.C. 154(b) by 235 days.

(21) Appl. No.: 12/370,045

(22) Filed: Feb. 12, 2009

(65) Prior Publication Data

US 2009/0230963 A1 Sep. 17, 2009

(30) Foreign Application Priority Data

Feb. 14, 2008 (DE) .......................... 10 2008 009 376

(51) Int. Cl.
*G01V 3/00* (2006.01)
(52) U.S. Cl. ........................................ 324/318; 324/309
(58) Field of Classification Search .......... 324/300–322; 600/407–445
See application file for complete search history.

(56) References Cited

U.S. PATENT DOCUMENTS

| | | | |
|---|---|---|---|
| 3,122,703 A | 2/1964 | Rempel et al. | |
| 3,372,331 A | 3/1968 | Larson | |
| 4,437,063 A | 3/1984 | Biehl et al. | |
| 4,633,180 A | 12/1986 | Biehl et al. | |
| 4,939,465 A * | 7/1990 | Biehl et al. | 324/318 |
| 4,992,737 A * | 2/1991 | Schnur | 324/318 |
| 7,436,181 B2 | 10/2008 | Krahn et al. | |
| 7,602,187 B2 * | 10/2009 | Luedeke et al. | 324/318 |
| 7,622,928 B2 * | 11/2009 | Gauss et al. | 324/322 |
| 2007/0007961 A1 | 1/2007 | Habara et al. | |
| 2007/0030005 A1 | 2/2007 | Krahn et al. | |

FOREIGN PATENT DOCUMENTS

DE 198 34 939 A1 2/2000

OTHER PUBLICATIONS

Hessinger, et al., "Magic-Angle Sample Spinning Electron Paramagnetic Resonance—Instrumentation, Performance and Limitations", Journal of Magnetic Resonance, vol. 147, p. 217-225, (2000) Mainz, Germany, Academic Press.

* cited by examiner

*Primary Examiner* — Brij B Shrivastav
(74) *Attorney, Agent, or Firm* — Law Office of Paul E. Kudirka

(57) ABSTRACT

A resonator assembly for executing measurements on a sample within a constant magnetic field $B_0$ by means of magnetic resonance is disclosed. It comprises a resonator portion defining a longitudinal axis and an axial direction. The resonator portion has, along the axial direction, a hollow cavity for exciting electron resonance within the sample. A coupling portion is provided adjacent the resonator portion and has, along the longitudinal axis, a stepped through being electrically conductive at its inner surface. A first, middle section of the stepped through configures the hollow cavity. A second and a third, lateral section adjacent axially opposed sides of the hollow cavity are each dimensioned such that a basic mode being resonant within the hollow cavity is unable to propagate within the second and the third section. A coil is wound around the resonator portion for additionally exciting a nuclear resonance within the sample. The resonator portion comprises a toroidal body made from an electrically conductive material within which there is provided the stepped through. The toroidal body is provided with at least one axial slit.

16 Claims, 6 Drawing Sheets

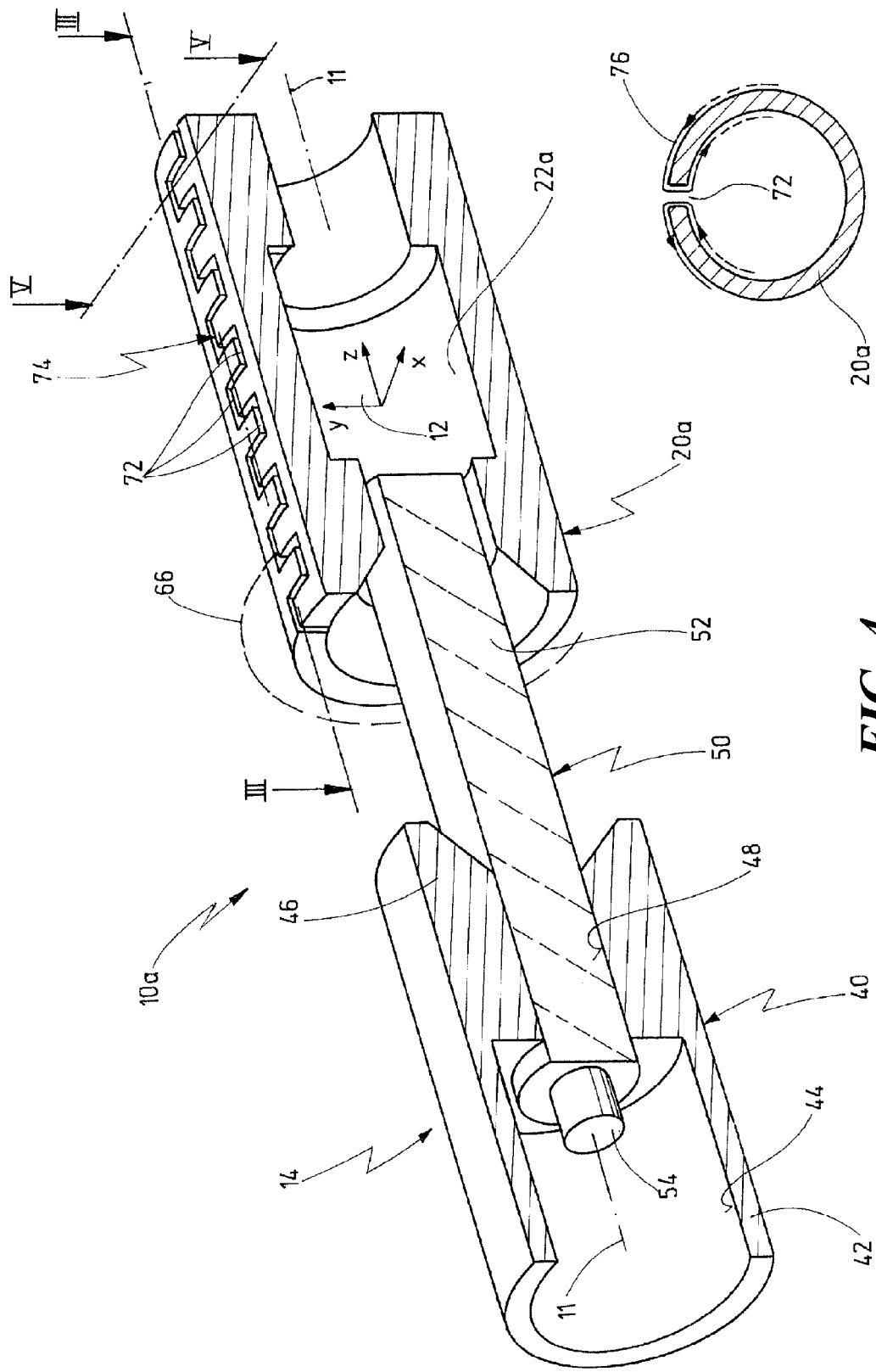

MAGNETIC RESONANCE RESONATOR ASSEMBLY

FIELD

The invention is related to the field of magnetic resonance.

More specifically, the invention is related to resonators for magnetic resonance permitting the execution of Electron-Nuclear Double Resonance (ENDOR) experiments.

Still more specifically, the invention is related to a resonator assembly for executing measurements on a sample within a constant magnetic field by means of magnetic resonance, comprising a resonator portion defining a longitudinal axis, the resonator portion having along an axial direction a hollow cavity for exciting electron resonance within the sample, and a coupling portion adjacent the resonator portion in an axial direction, the resonator portion being provided in the direction of the longitudinal axis with a stepped through being electrically conductive at its inner surface, a first, middle section of which configuring the hollow cavity, and a second and a third section of which adjacent axially opposed sides of the hollow cavity being each dimensioned such that a basic mode being resonant within the hollow cavity is unable to propagate within the second and the third section.

BACKGROUND

For executing measurements on samples by means of magnetic resonance, one needs a radiofrequency magnetic field which, together with a constant magnetic field, excites magnetic resonance phenomena within the sample. In order to generate a radiofrequency magnetic field of utmost intensity at the location of the sample, various resonator assemblies have become known.

For measurements by means of nuclear resonance, the frequency of the magnetic field is conventionally of the order of several 100 MHz. In that case, the resonator assemblies are mostly configured as coil assemblies. For measurements by means of electron resonance, however, the frequency of the magnetic field is of the order of several 10 GHz up to several 100 GHz due to the much higher gyromagnetic ratio of electrons. In that case, the resonator assemblies are conventionally configured as hollow cavity resonators.

U.S. Pat. No. 4,437,063 discloses a probe head for measuring paramagnetic electron resonance. The probe head comprises a hollow cavity resonator being configured within a cylindrical tube section between a piston and an end of the tube closed by a coupling member. An axial bore is provided through the piston for introducing a sample. A non-axial hollow waveguide section is provided within the opposed coupling member. The oscillation mode being able to propagate within the hollow cavity for exciting electron resonance within the sample, is unable to propagate within the hollow waveguide section and within the axial bore for the sample. The prior art probe head is not intended to nor adapted for being used for the simultaneous excitation of nuclear resonance within the sample.

For hollow cavity resonators, the coupling of the microwave signal as well as the receiving of a sample is of particular importance. For coupling the microwave signal, an iris coupling is conventionally used or a coupling by means of an antenna. For very high microwave frequencies of the order of several 100 GHz, however, problems arise due to the very small dimensions of the components which basically correspond to the wavelength which, for 300 GHz, is only 1 mm.

In this connection, a particular ENDOR (Electron Nuclear Double Resonance) resonator assembly has become known from a project of Denysenkov et al. In this resonator assembly, electron resonance (ESR) at a frequency of 260 GHz and nuclear resonance (NMR) at a frequency of 400 MHz are simultaneously excited within a sample being positioned within a constant magnetic field of 9.4 T field strength. This prior art resonator assembly uses a cylindrical hollow cavity resonator for the ESR microwave field being configured by helicoidally winding a band-shaped material. The helix, thus configured, is simultaneously used as a radiofrequency coil for the irradiation of the NMR radio frequency field. Two cylindrical and metallically coated short-circuit plungers are introduced into the hollow cavity in an axial direction from opposite sides. One of the short-circuit plungers or both are configured axially displaceable for tuning the frequency. The ESR microwave field is laterally coupled by means of a coupling iris from a hollow waveguide. The coupling iris is located in the center of the helix. A liquid sample is provided within a quartz capillary being located along the axis of the hollow cavity, i.e. between the short-circuit plungers.

In this prior art assembly, the coupling of the microwave field is difficult and, for inserting a sample into the hollow cavity, it is necessary to remove one of the short-circuit plungers beforehand, provided that no central through opening is provided in one of the short-circuit plungers.

Published U.S. patent application 2007/0030005 A1 discloses a probe head for nuclear resonance measurements. The probe head is configured for executing MAS-experiments in which the sample rotates about an axis which is inclined relative to the direction of the main field by the so-called "magic angle" of 54.7°. The radio frequency field is irradiated on the sample by means of a dielectric resonator being arranged around the sample as a hollow cylinder. For exciting a second kind of nuclei, the probe head is, further, provided with a solenoid coil being arranged around the sample within the dielectric resonator. An excitation of electron resonance is not provided.

German citation DE 198 34 939 A1 describes a micro spectrometer for the ESR spectroscopy in which for frequency-tuning a $H_{102}$-resonator, a dielectric bolt is screwed into the resonator.

U.S. Pat. No. 4,633,180 discloses a hollow cavity resonator being configured as a so-called split-ring-resonator, i.e. for example comprising two half-cylindrical shells being positioned mirror-symmetrically with regard to a longitudinal axis and being at a distance from each other with a gap in a circumferential direction.

U.S. published patent application 2007/0007961 A1 describes a spectrometer in which a nuclear resonance or an electron resonance is excited by irradiating a corresponding radio frequency magnetic field on the sample under investigation by means of an antenna.

U.S. Pat. No. 3,372,331 discloses a gyromagnetic spectrometer utilizing a helix as a transmitter and receiver coil for ESR signals. The helix is fed from a coaxial line, wherein the transition from the coaxial line to the helix is configured as a dielectric taper.

U.S. Pat. No. 3,122,703 discloses a hollow cavity resonator for ESR measurements in which particular portions of the resonator housing consist of a material of higher specific resistance as compared to the remaining portions and in which the inner surface of the housing is covered with a layer of diamagnetic material.

In a publication of Hessinger, D. et al., Journal of Magnetic Resonance, 147, p. 217-225 (2000), there is described a pulsed ESR spectrometer for MAS measurements utilizing a dielectric ring from sapphire as a resonator.

SUMMARY

It is, therefore, an object underlying the invention to provide a resonator assembly of the type specified at the outset, so that magnetic resonance measurements are improved. In particular, such measurements shall be facilitated at very high frequencies. Moreover, measurements shall be enabled which encompass double resonances at high frequencies, i.e. measurements with dynamic polarization (DNP) or electron-nuclear-double resonances (ENDOR).

In a resonator assembly of the type specified at the outset, this object is achieved in that means are provided for additionally exciting a nuclear resonance within the sample, the means being configured as a coil wound around the resonator portion, the resonator portion comprising a toroidal body made from an electrically conductive material within which there is provided the stepped through, and that the toroidal body is provided with at least one axial slit.

The object underlying the invention is, thereby, entirely solved.

The invention, namely, allows to reliably excite a resonant basic mode of oscillation within a hollow cavity at very high frequencies and, thereby, to configure a resonator of extremely high quality in which the field distribution is almost entirely undisturbed. In that case, the hollow cavity is accessible from two opposed sides, such that a coupling becomes possible from one of the sides operating with easily operable elements, whereas a sample may be introduced and exchanged from the other side, without the necessity of removing components beforehand.

The invention, further, has the advantage that currents induced within the surface of the body from the radiofrequency field irradiated from outside, do not become effective in a damaging manner, because the axial slit configures a split-ring structure.

Although the shape of the hollow cavity is not subject to any limitation within the scope of the present invention, a hollow cavity is preferably used being cylindrical, wherein the longitudinal axis of the hollow cavity coincides with the longitudinal axis of the resonator portion.

This measure has the advantage that well-proven resonator structures may be used.

It is particularly preferred when the third through section is positioned adjacent the side of the hollow cavity opposite the coupling portion and comprises a sample holder.

This measure has the advantage that there is a particularly good accessibility of the hollow cavity for the sample, and that the sample may easily be exchanged.

In another preferred embodiment of the invention, the second through section is positioned adjacent the side of the hollow cavity facing the coupling portion, the coupling portion comprising a dielectric rod extending along the longitudinal axis of the resonator portion, and a first end of the dielectric rod protrudes into the second through section with a radial distance.

This measure has the advantage that the threshold frequency is reduced by the dielectric during the coupling.

In that event, a particularly good effect is achieved in that the first end of the dielectric rod terminates within the second through section in a predetermined distance from the hollow cavity.

This measure has the advantage that a critical coupling may be set by appropriately setting the predetermined distance.

Moreover, it is preferred in this context when a second end of the dielectric rod opposite the first end is received partially within a through bore of a body of the coupling portion and terminates in a hollow waveguide, the body being electrically conductive at least on an inner surface thereof.

This measure has the advantage that the connection to a conventional microwave source may be established in a simple manner.

In particular, it is provided that the second end of the dielectric rod protrudes into the hollow waveguide with a predetermined distance, wherein, preferably, the second end comprises an axial protrusion of reduced cross section extending with a further predetermined distance into the hollow waveguide.

For further preferred improvements of the afore-explained embodiments, the second through section widens up on the side opposite the hollow cavity towards the coupling portion. Correspondingly, it is preferred when the through bore widens up in a direction towards the resonator portion.

This measure has the advantage that the transition into and from the dielectric rod is made continuous and that no unwanted standing waves are created.

Although the present invention has no limitation with regard to the cross-sectional shape of the dielectric rod, it is preferred when the same is cylindrical. This shape, in particular in cooperation with a cylindrical hollow cavity resonator and a cylindrical hollow waveguide connection, likewise, establishes a continuous transition without any unwanted standing waves.

In still another preferred improvement of the invention, the axial slit is configured within the toroidal body by sections of a meander-shaped axial slit.

This measure has the advantage that the split-ring-structure is maintained on the one hand and that the microwave field generated within the hollow cavity does not exit, on the other hand.

In still another variation, the toroidal body is made massively and is provided with a helical slit, such that it configures a helix.

This measure has the advantage that a particularly compact design is achieved which is quite advantageous for very small probe head spaces in high field magnets.

In still another variation, the toroidal body is configured by a wire coil having a stepped diameter.

This measure, likewise, has the advantage that a compact design is achieved.

In another group of embodiments, additional means are provided for exciting still another nuclear resonance within the sample.

This measure has the advantage that further measurements may be executed in which, for example, a first kind of nuclei is observed and a second kind of nuclei is saturated.

Finally, still another embodiment may be used according to the invention in which the resonator portion is positioned within a housing rotatably about the longitudinal axis, and means being provided for fastening the housing under a predetermined angle relative to the direction of the constant magnetic field. This measure has the advantage that measurements under the so-called "magic angle" become possible.

Further advantages will become apparent from the description and the drawing.

It goes without saying that the features mentioned before and those that will be explained hereinafter, may not only be used in the particularly given combination, but also in other combinations, or alone, without leaving the scope of the present invention.

BRIEF DESCRIPTION OF THE DRAWINGS

Embodiments of the invention are shown in the drawings and will be explained in further detail throughout the subsequent description.

FIG. 4 shows a perspective view of the second embodiment as a whole;

FIG. 5 shows a detail from FIG. 4, in a radial section along the line v-v of FIG. 4;

DETAILED DESCRIPTION

Figure 1:
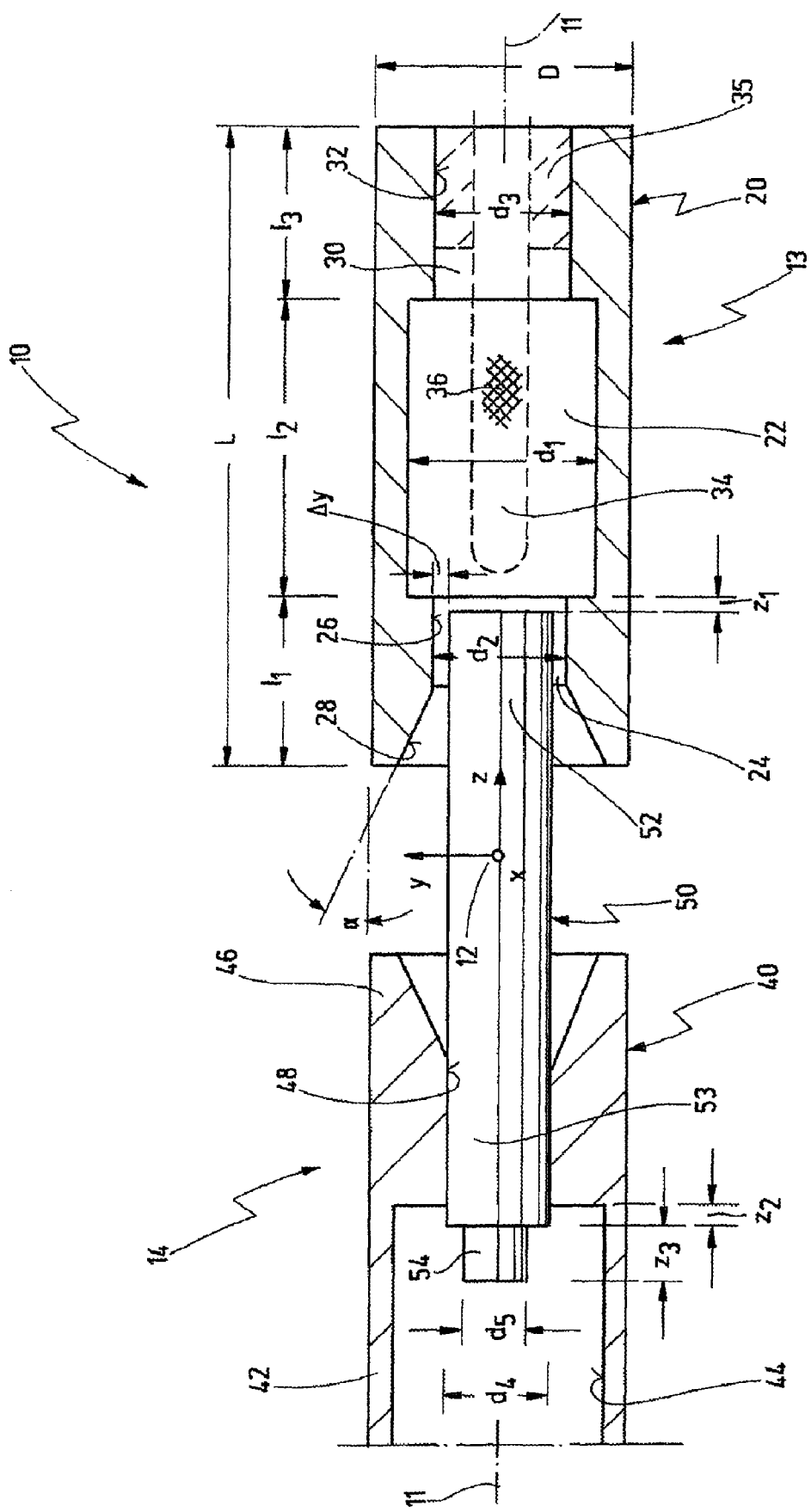
FIG. 1 shows a schematic side elevational and sectional view of a first embodiment of a resonator assembly according to the present invention.

In FIG. 1, reference numeral 10 as a whole designates a resonator assembly according to a first embodiment of the present invention. Resonator assembly 10 extends along a longitudinal axis 11 which, in turn, extends parallel to a z-axis of a Cartesian coordinate system indicated at 12.

Resonator assembly 10 has a resonator portion 13 and a coupling portion 14.

Resonator portion 13 essentially consists of a first, toroidal body 20 having a length L. in the embodiment shown, the design of body 20 as a whole is cylindrical, however, this is just a preferred embodiment and is not mandatory. Within body 20, there is provided an axially stepped, cylindrical through having three sections of different dimensions.

A first section is configured by a central hollow cavity 22 having a diameter $d_1$ and a length $l_1$. On the left hand side in FIG. 1, there is an adjacent second through section 24 of length $l_2$. Second through section 24 is subdivided in a right, cylindrical portion 26 of diameter $d_2$ and a left, adjacent conical portion 28 widening from diameter $d_2$ leftwards under an angle $\alpha$. On the right side of hollow cavity 22, there is adjacent a third through section 30 of length h, consisting only of a cylindrical portion 32 of diameter $d_3$. In the illustrated preferred embodiment, $d_2=d_3$.

A sample container, being a sample tube 34 in the illustrated embodiment, is positioned along longitudinal axis 11 within hollow cavity 22. For that purpose, a sample holder 35 is provided within cylindrical portion 32. Sample tube 34 contains a liquid or solid sample 36.

Coupling portion 14 comprises a second, toroidal body 40. Toroidal body 40, likewise, is preferably configured cylindrical, which, however, is not mandatory. Second toroidal body 40 is provided with a left section 42 being configured as a cylindrical hollow waveguide 44. Via cylindrical hollow waveguide 44, coupling portion 14 is connected to a microwave source in a conventional manner. A right section 46 of second toroidal body 40 is provided with a through bore 48 having a diameter $d_4$. In the illustrated embodiment, $d_4<d_2$, $d_3$.

A dielectric rod 50 being cylindrical in the illustrated embodiment, is positioned along longitudinal axis 11. Dielectric rod 50 has a diameter $d_4$. In the illustration of FIG. 1, a right terminal end 52 of dielectric rod 50 protrudes with a radial distance $z_1$ into cylindrical section 26 and terminates with its front end at an axial distance $z_1$ in front of the transition between cylindrical portion 26 and hollow cavity 22. A left end 53 of dielectric rod 30, as shown in FIG. 1, protrudes with an axial length $z_2$ into cylindrical hollow waveguide 44 and, then, extends with an axial protrusion 54 of diameter $d_5$ by still another axial distance $z_3$.

Figure 2:
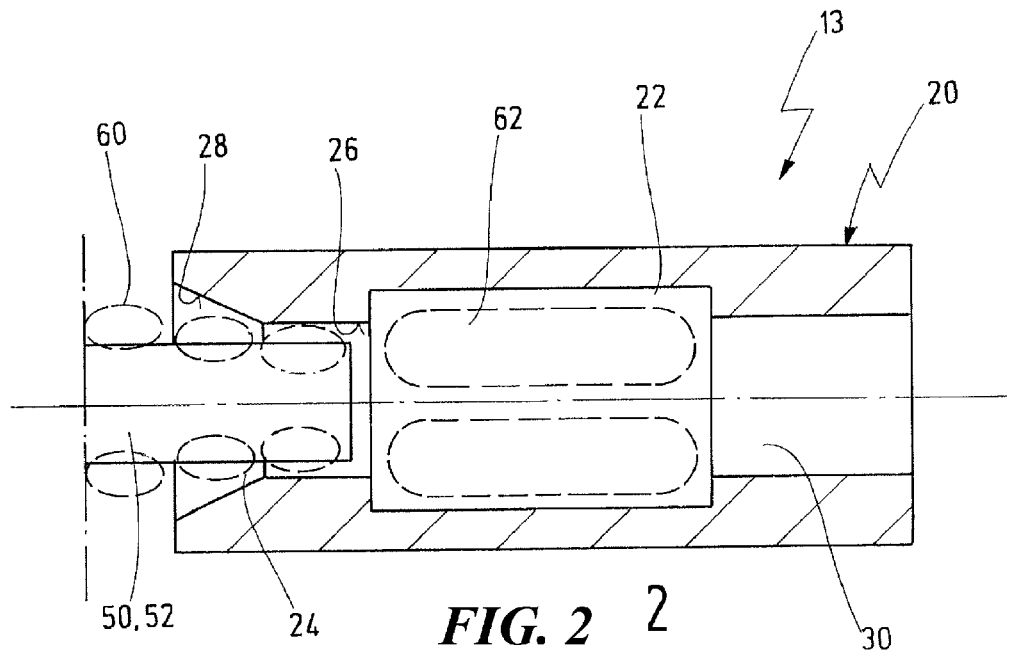
FIG. 2 shows a detail from FIG. 1, namely a resonator portion for illustrating the operation.

FIG. 2, in a highly schematic manner, shows the coupling of a radiofrequency magnetic field into hollow cavity 22. The radiofrequency signal is a microwave signal of the cylindrical mode $TE_{01}$.

On the left side of FIG. 2, one can see that closed magnetic field lines 60 intersect with the surface of dielectric rod 50, extending freely. At the position where dielectric rod 50 enters the area of conical portion 28, the field lines are forced into dielectric rod 50 and, then, excite a basic wave 62 within hollow cavity 22. In the embodiment shown, basic wave or mode 62 is of the type $TE_{011}$. Distance $z_1$ is set such that a critical coupling to hollow cavity 22 exists. For that purpose, dielectric rod 50 may be adapted to be axially displaced, for example by means of a fine-thread screwing apparatus, not shown for the sake of simplicity.

It is of particular importance that diameters $d_2$ and $d_3$ are dimensioned such that $TE_{01}$ waves having the radiofrequency of hollow cavity 22, are unable to propagate there.

In a preferred embodiment, with a resonance frequency $f_{ESR}$ of hollow cavity 22 amounting to 94 GHz, the aforementioned dimensions are as follows:

L=11 mm
$l_1$=5 mm
$l_2$=3 mm
$l_3$=3 mm
$d_1$=4.6 mm
$d_2$=2.5 mm
$d_3$=2.5 mm
$d_4$=2.5 mm
$d_5$=1.25 mm
$z_1$=0.3 mm
$Z_2$=0.5 mm
$Z_3$=1.1 mm
$\alpha$=45°

The embodiment of FIGS. 1 and 2 utilizes a closed first toroidal body 20. It is, in the first place, appropriate for electron resonance measurements.

Figure 3:
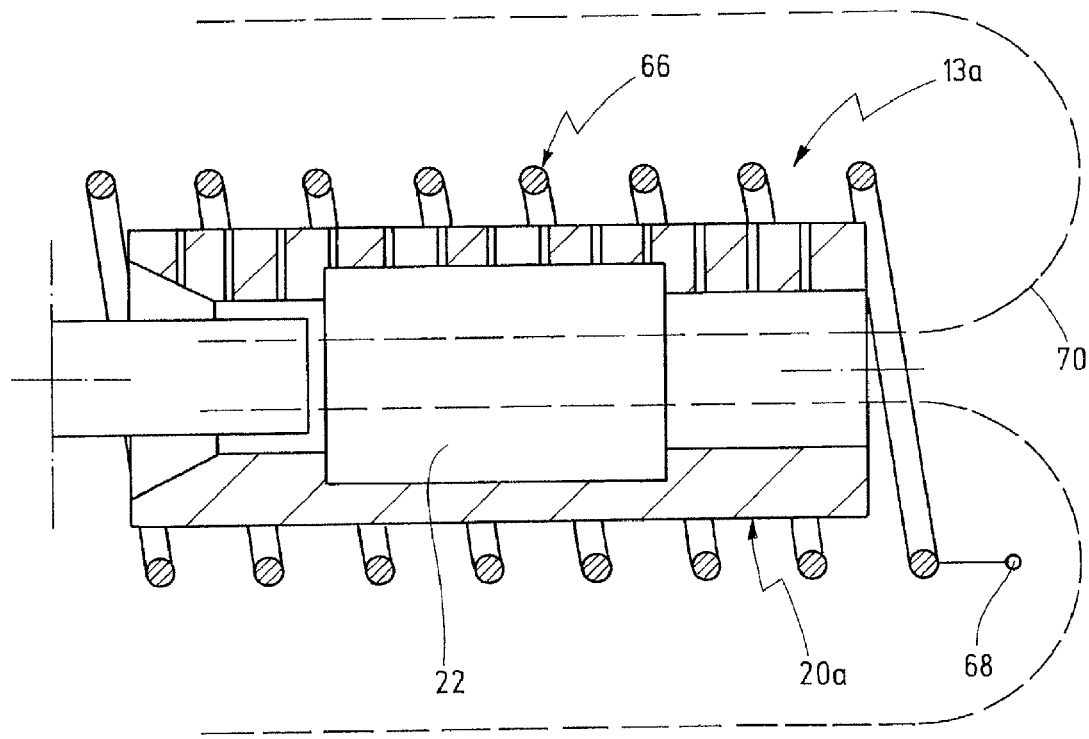
FIG. 3 shows a depiction, similar to that of FIG. 2, however, for a second embodiment of the invention, in an axial section along the plane III-III of FIG. 4.

For applications in which additionally to the excitation of magnetic resonance of electrons nuclei are also excited, an embodiment is preferred, as shown in FIGS. 3 to 5. In this embodiment, the first toroidal body of resonator portion 13a is somewhat modified and, hence, indicated by 20a. The coupling portion remains unchanged as compared to the embodiment of FIGS. 1 and 2.

In this embodiment, a radiofrequency coil 66 being designed as a solenoid coil is wound around first toroidal body 20a. Via a connection 68, coil 66 may be fed with a radiofrequency signal of frequency $f_{NMR}$ For making it possible that the radio frequency field generated by coil 66 and having magnetic field lines indicated at 70, can enter into hollow cavity 22, first toroidal body 20a is slitted in an axial direction. FIG. 4 shows in a perspective view that a meander-shaped slit 74 is provided having axial sections 72 configuring the axial slit. FIG. 5 shows the effect of axial slit 72. Axial slit 72 effects that the wall currents 76 induced by the high frequency field on the outer surface of first toroidal body 20a run in a first peripheral direction (in the embodiment shown in a counter-clockwise direction), then run through the axial slit 72 on the inner surface, and then run in the opposite peripheral direction (in the embodiment shown in a clockwise direction). This structure is identified in the art as "split ring".

Figure 6:
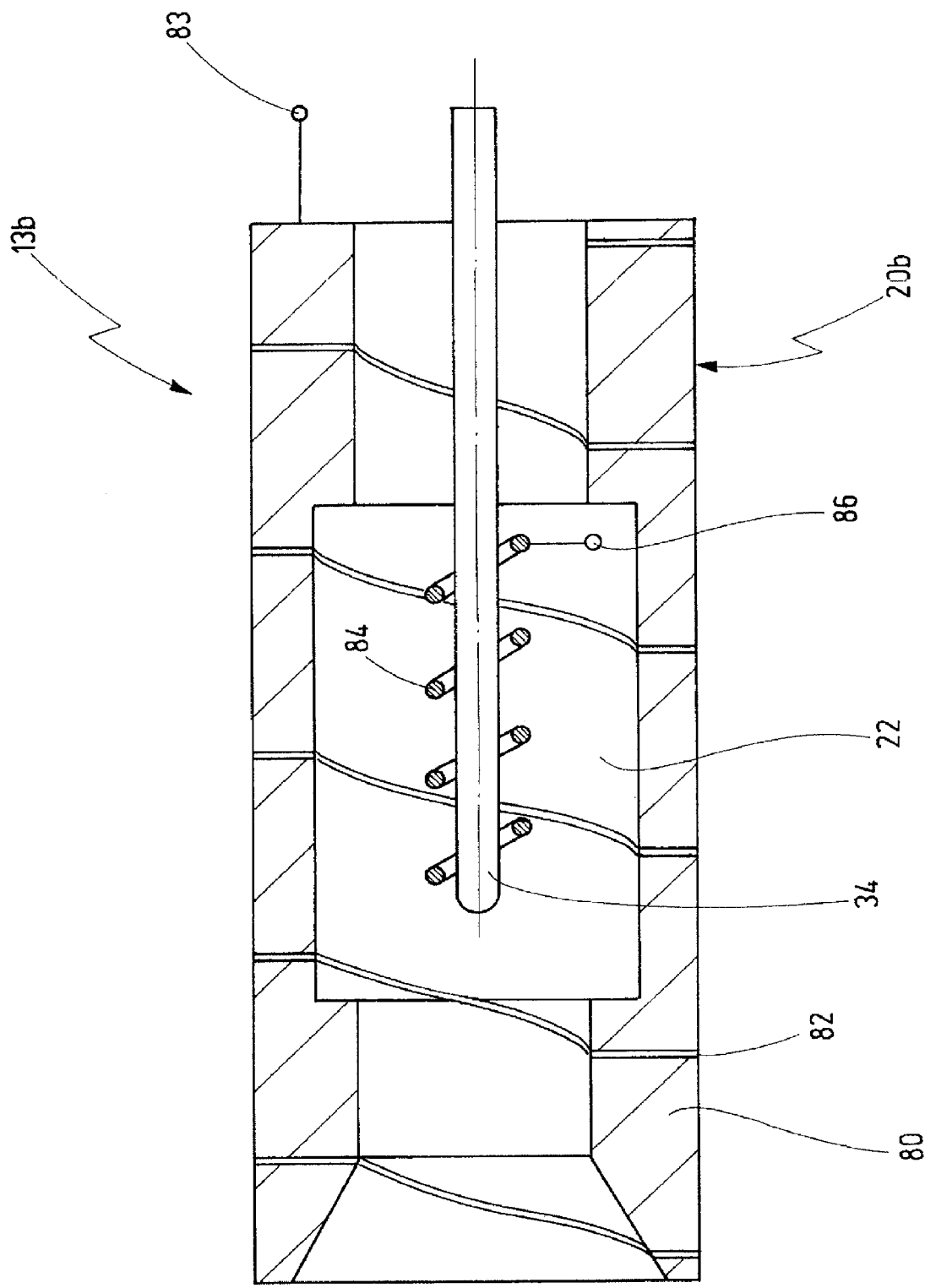
FIG. 6 shows a depiction, similar to that of FIG. 3, however, for a third embodiment of the invention.

In the third embodiment of the invention, as shown in FIG. 6, a first toroidal body 20b of resonator portion 13b is used being modified in another manner. Body 20b, namely, is configured as a helix 80 by applying a helical slit 82 therein. By doing so, body 20b simultaneously is a coil for the radiofrequency signal irradiating the nuclei and, for that purpose, is provided with a connection 83.

FIG. 6 shows still another improvement of the invention. Within hollow cavity, sample tube 34 is surrounded by another coil 84, namely a wire coil. Coil 84 may be fed via a connection 86 with a further radiofrequency signal for irradiating still another kind of nuclei. Seen as a whole, a triple resonance is irradiated, namely electron resonance within hollow cavity 22 by microwave frequency $f_{ESR}$, a nuclear resonance of a first kind of nuclei within helical coil 80 at radiofrequency $f_{NMR1}$, and a nuclear resonance of a second kind of nuclei within coil 84 at radiofrequency $f_{NMR2}$.

Figure 7:
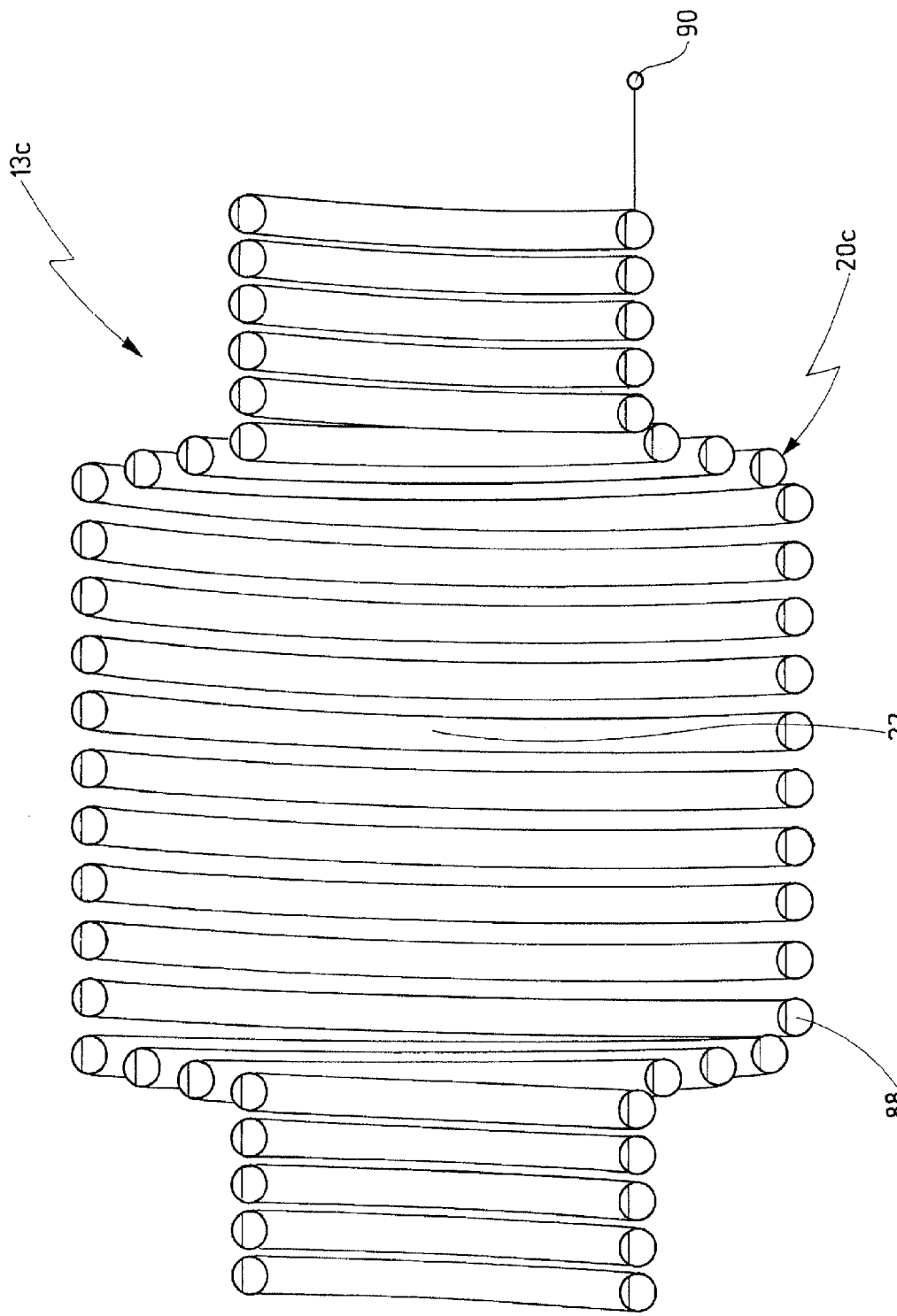
FIG. 7 shows another depiction, similar to that of FIG. 3, however, on an enlarged scale and strongly simplified, for a fourth embodiment of the invention.

FIG. 7 shows a fourth embodiment of the invention. In this embodiment, first toroidal body 20c of resonator portion 13c is configured as a wire coil 88 being stepped in diameter. Wire coil 88, thereby, configures hollow cavity 22. It may, namely, be fed with a radiofrequency signal via a connection 90 and, thereby, excite additional nuclear resonance within hollow cavity 22.

Figure 8:
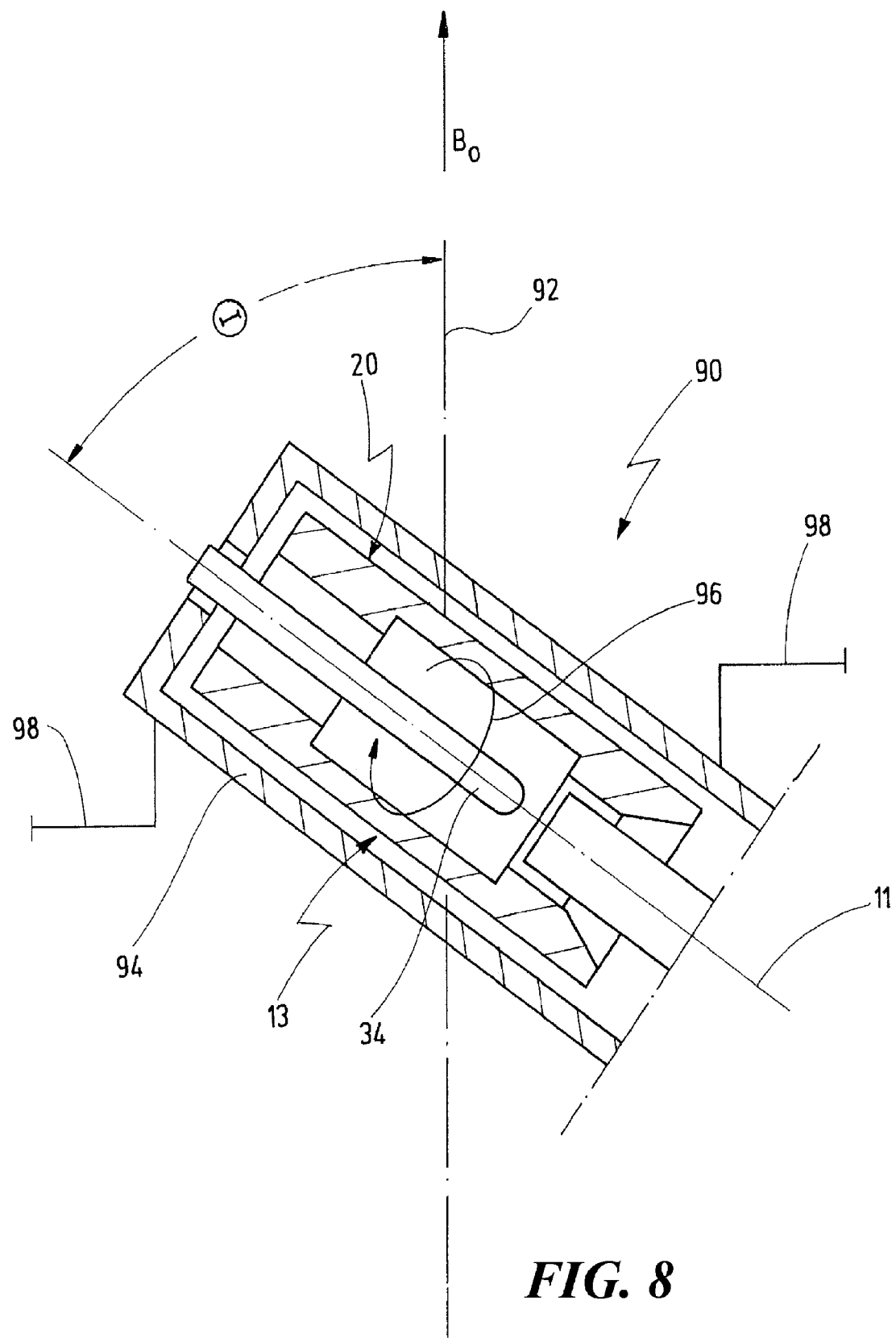
FIG. 8 shows a schematic side elevational view, as a section, of a fifth embodiment of the invention.

FIG. 8, finally, illustrates that the resonator assembly according to the present invention may, in a particularly preferred manner, also be used for measuring nuclear resonance under the so-called "magic angle" θ=54.7° (MAS Magic Angle Spinning). For that purpose, the direction of the constant magnetic field $B_0$ is indicated at 92 in FIG. 8, which corresponds to the z-axis. Resonator portion 13 is housed within a housing 94 and longitudinal axis 11 is inclined relative to direction 92 by the afore-mentioned angle θ. Housing 94 is attached to an inner surface of a probe head (not shown), for example by means of a fastener 98. An arrow 96 indicates that first toroidal body 20 rotates together with sample tube 34 about longitudinal axis 11. For that purpose, body 20 is, for example, provided with turbine blades, or may be connected with a conventional MAS-rotor (not shown), being exposed to compressed air, as is known to the person of ordinary skill. The microwave signal may be coupled-in by means of a stationary coupling.

If, in the MAS resonator assembly of FIG. 8, a resonator portion 13b as in FIG. 6 shall be used, having still another coil for a second nuclear frequency, then the radiofrequency signal required for wire coil 84 may be coupled-in by means of a stationary coil being wound around the outside of housing 94 (not shown).

What is claimed is:

1. A resonator assembly for executing measurements on a sample within a constant magnetic field $B_0$ by means of magnetic resonance, comprising a resonator portion defining a longitudinal axis and an axial direction, said resonator portion having along said axial direction a hollow cavity for exciting electron resonance within said sample, and a coupling portion adjacent said resonator portion in said axial direction, said resonator portion being provided in said direction of said longitudinal axis with a stepped through being electrically conductive at its inner surface, a first, middle section of said stepped through configuring said hollow cavity, and a second and a third, lateral section of said stepped through adjacent axially opposed sides of said hollow cavity being each dimensioned such that a basic mode being resonant within said hollow cavity is unable to propagate within said second and said third section, wherein means are provided for additionally exciting a nuclear resonance within said sample, said means being configured as a coil wound around said resonator portion, said resonator portion comprising a toroidal body made from an electrically conductive material within which there is provided said stepped through, and that said toroidal body is provided with at least one axial slit.

2. The resonator assembly of claim 1, wherein said hollow cavity is cylindrical and a longitudinal axis of said hollow cavity coincides with said longitudinal axis of said resonator portion.

3. The resonator assembly of claim 1, wherein said third through section is positioned adjacent the side of said hollow cavity opposite said coupling portion and comprises a sample holder.

4. The resonator assembly of claim 1, wherein said second through section is positioned adjacent a side of said hollow cavity facing said coupling portion, said coupling portion comprising a dielectric rod extending along said longitudinal axis of said resonator portion, and a first end of said dielectric rod protrudes into said second through section with a radial distance Δy.

5. The resonator assembly of claim 4, wherein said first end of said dielectric rod terminates within said second through section in a predetermined axial distance $z_1$ from said hollow cavity.

6. The resonator assembly of claim 4, wherein a second end of said dielectric rod opposite said first end is received partially within a through bore of a body of said coupling portion and terminates in a hollow wave guide, said body being electrically conductive at least on an inner surface thereof.

7. The resonator assembly of claim 6, wherein said second end of said dielectric rod extends into said hollow wave guide with a predetermined axial distance $z_2$.

8. The resonator assembly of claim 7, wherein said second end comprises an axial protrusion of reduced cross section extending with a further predetermined axial distance $z_3$ into said hollow wave guide.

9. The resonator assembly of claim 4, wherein said second through section widens up on the side opposite said hollow cavity towards said coupling portion.

10. The resonator assembly of claim 6, wherein said through bore widens up in a direction towards said resonator portion.

11. The resonator assembly of claim 4, wherein said dielectric rod is cylindrical.

12. The resonator assembly of claim 1, wherein said axial slit is configured within said toroidal body by sections of a meander-shaped axial slit.

13. The resonator assembly of claim 12, wherein said toroidal body is made massively and is provided with a helical slit such that it configures a helix.

14. The resonator assembly of claim 12, wherein said toroidal body is configured by a wire coil having a stepped diameter.

15. The resonator assembly of claim 1, wherein additional means are provided for exciting still another nuclear resonance within said sample.

16. The resonator assembly of claim 1, wherein said resonator portion is positioned within a housing rotatably about said longitudinal axis, means being provided for fastening said housing under a predetermined angle Θ relative to a direction of said constant magnetic field $B_0$.

* * * * *